US 6,632,751 B2

(12) United States Patent
Mertens et al.

(10) Patent No.: US 6,632,751 B2
(45) Date of Patent: Oct. 14, 2003

(54) METHOD AND APPARATUS FOR LIQUID-TREATING AND DRYING A SUBSTRATE

(75) Inventors: Paul Mertens, Bonheiden (BE); Marc Meuris, Keerbergen (BE)

(73) Assignee: Interuniversitair Microelekronica Centrum (IMEC VZW), Leuven (BE)

( * ) Notice: Subject to any disclaimer, the term of this patent is extended or adjusted under 35 U.S.C. 154(b) by 0 days.

(21) Appl. No.: 09/892,269

(22) Filed: Jun. 27, 2001

(65) Prior Publication Data

US 2002/0016082 A1 Feb. 7, 2002

Related U.S. Application Data

(60) Provisional application No. 60/214,693, filed on Jun. 27, 2000.

(51) Int. Cl.⁷ .............................................. H01L 21/00
(52) U.S. Cl. .......................... 438/800; 134/78; 134/30; 134/1.3; 134/25.5
(58) Field of Search ................................ 438/245–748, 438/906, 800; 134/30, 64, 137

(56) References Cited

U.S. PATENT DOCUMENTS

| | | | | |
|---|---|---|---|---|
| 4,483,040 A | * | 11/1984 | Magee et al. ................. 15/302 |
| 5,569,330 A | * | 10/1996 | Schild et al. | |
| 5,571,337 A | * | 11/1996 | Mohindra et al. ......... 134/25.4 |
| 5,660,642 A | * | 8/1997 | Britten .......................... 134/64 |
| 6,012,472 A | * | 1/2000 | Leenaars et al. ............ 134/137 |
| 6,139,645 A | * | 10/2000 | Leenaars et al. .............. 134/30 |
| 6,199,564 B1 | * | 3/2001 | Yokomizo ..................... 134/78 |
| 6,318,382 B1 | * | 11/2001 | Katagiri et al. .............. 134/1.3 |

FOREIGN PATENT DOCUMENTS

| | | | |
|---|---|---|---|
| DE | 44 13 077 | * | 10/1995 |
| EP | 0 385 536 | * | 9/1990 |
| EP | 0 817 246 | * | 1/1998 |
| WO | 99/08057 | * | 2/1999 |

* cited by examiner

Primary Examiner—David Nelms
Assistant Examiner—Thao Le
(74) Attorney, Agent, or Firm—McDonnell Boehnen Hulbert & Berghoff

(57) ABSTRACT

The present invention is related to a method and apparatus for liquid treating and drying a substrate, such as a semiconductor wafer, the method comprising the step of immersing a substrate or a batch of substrates in a tank filled with a liquid, and removing the substrate(s) through an opening so that a flow of the liquid takes place through the opening during removal of the substrate. Simultaneously with the removal, a reduction of the surface tension of the liquid is caused to take place near the intersection line between the liquid and the substrate. For acquiring such a tensio-active effect, a uniform flow of a gas or vapor is used, or/and a local application of heat. The invention is equally related to an apparatus for performing the method of the invention.

26 Claims, 13 Drawing Sheets

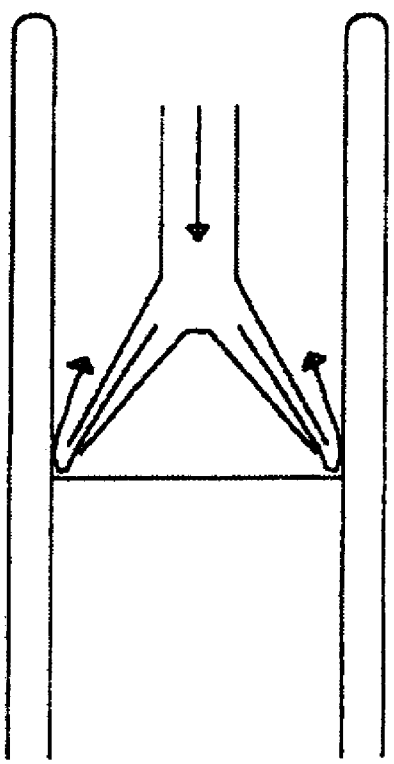
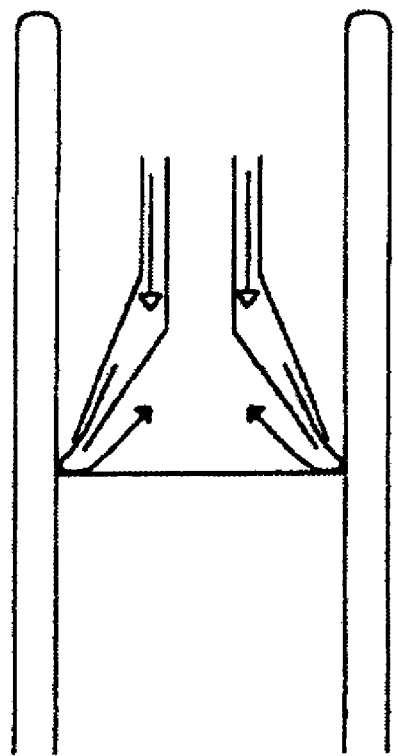
FIG. 6c                           FIG. 6d

METHOD AND APPARATUS FOR LIQUID-TREATING AND DRYING A SUBSTRATE

REFERENCE TO RELATED APPLICATIONS

The current patent application claims priority to U.S. Patent Application Serial No. 60/214,693 filed Jun. 27, 2000 entitled "Method For Removing A Liquid From A Flat Substrate And Method For Drying A Flat Substrate." This application incorporates by reference U.S. Patent Application Serial No. 60/214,693 in its entirety.

FIELD OF THE INVENTION

The present invention is related to methods and tools used for treating and in particular cleaning and drying surfaces of substrates such as semiconductor substrates used in the production of integrated circuits or flat panel displays, and equally of foil like substrates or wires.

STATE OF THE ART

The complete and efficient removal of a liquid from a surface of a substrate is a frequently repeated step in e.g. the fabrication process of integrated circuits. Such a step can be performed after a wet etching step, a wet cleaning step, a wet rinsing step or any other step used in the fabrication process wherein a substrate is treated by, exposed to or immersed in a liquid. The substrate can be a semiconductor wafer or a part thereof or a glass slice or any other slice of material. It can also be a continuous film or foil or a wire or a set of parallel wires.

The manufacturing of integrated circuits evolves towards processing of each wafer individually rather than in batches of several wafers. In state of the art IC manufacturing, most processing steps such as e.g. implantation steps or deposition steps are already performed in a single wafer mode. On the other hand, wet processing steps such as e.g. cleaning steps and subsequent liquid removal steps are typically performed in a batch mode because of lack of appropriate alternatives. Therefore, differences in waiting times are created for each individual wafer between a wet processing step, performed in a batch mode and another processing step, performed in a single wafer mode. Such variability is undesirable with regard to process control. Moreover, this mixed batch and single wafer processing increases the cycle time, which is also undesirable. Therefore, there is a general interest in the development of competitive single wafer or more generally, single substrate wet processing steps. Also, a method for treating and drying continuous foil or film like substrates and wire-like substrates is not present in the current state of the art.

With regard to the drying process, simultaneous drying of both sides of a substrate is desired in a reduced timespan. Knowing that in state of the art production lines a substrate is processed typically every 1 to 2 minutes, ideally, in order to avoid equipment duplication, the combined liquid process step and liquid removal step should be completed in at least such a time frame.

The principle of immersing a substrate in a treatment liquid and subsequently removing said substrate in such a way that a minimum of liquid remains attached to the substrate, is known. However, all existing methods and tools based on this principle possess fundamental drawbacks.

In the document EP-A-385536, a method is disclosed of drying substrates after treatment in a liquid by pulling said substrates out of a tank containing said liquid. While being slowly taken from the tank, the substrates are brought directly in contact with a vapor which is miscible with said liquid. When mixed with the liquid, the mixture has a surface tension lower than that of the liquid, i.e. the vapor works as a 'tensio-active' gaseous substance.

An important drawback of the method described in EP-A-385536 relates to the fact that virtually all the liquid in the tank must remain there after the substrates have been removed, which implicates that pulling the substrates out of the liquid must take place slowly. As a consequence, this method is typically applied to the simultaneous treatment of batches of substrates in order to meet throughput requirements. The flow of the tensio-active vapor is provided through two sets of nozzles, one set on each side of a substrate, causing two opposite flows of vapor, colliding in the middle of the substrate. As a result, in this middle part, drying will be less efficient than at the substrate's edges.

In document EP-A-817246, a method and apparatus is described for wet cleaning or etching of flat substrates. This document is related to an apparatus comprising a vessel partially filled with a liquid. A substrate is pulled through said stationary liquid by way of slits in the vessel's sides under the liquid surface. The vessel is placed in a gaseous environment, preferably comprising a tensio-active gas. In this method the wafer is moved preferably horizontally. The horizontal position can be undesirable in terms of tool-footprint minimization or for integration of the drying method with other manufacturing equipment. Besides that, the apparatus described in this document is designed so as to allow no liquid to leave the vessel before, after and most importantly during the transit of the substrates, so as not to wet these substrates. This means that the substrate needs to be removed from the vessel slowly. Because no flow of liquid takes place through the slits, this potentially causes the problem of particle build-up in the slit: small particles become attached to the side walls of the slit and attach to the substrate's surface as it is passing through. Another drawback is that the slit through which the substrate is removed, is necessarily very narrow (order of 1.5 mm for a 0.75 mm thick substrate). Moreover, narrow horizontal slits are difficult to combine with large substrates ($\tau$ 300 mm in diameter), which often suffer from a significant 'bow' phenomenon, i.e. a bending of the central part with respect to the edges, as a result of asymmetric stress, e.g. thermal stress, or simply as an effect of gravity in case of the horizontal or tilted position of substrates.

U.S. Pat. No. 5,660,642 describes an apparatus wherein a substrate is pulled out of a tank, while being sprayed with a liquid inside said tank, above a stationary liquid surface. A porous medium or other solvent vapor source is placed around the opening through which the substrate is pulled out, and produces vapors to be adsorbed by the substrate in order to remove liquid attached to it. No liquid is allowed to flow out of said tank while the substrate is being pulled out. Also, no flow of a tensio-active gas is directed at the substrate, which is merely passively brought into contact with a vapor, not a flow of vapor. This necessarily puts a constraint on the allowable removal speed of the substrate, which renders this technique unable to fulfill current treatment speed requirements. Also, a spray is often undesirable, as it deteriorates the subsequent drying performance: after spraying, residues can be detected (with reactive light scattering inspection techniques) on the surface, e.g. on hydrophobic surfaces sprayed with water, when the drying step is completed.

Document DE-A-4413077 describes a method and apparatus for treating and/or cleaning and drying a substrate, by lifting said substrate or preferably a batch of substrates, out of a cylindrical bath. Liquid is allowed to flow over the edge of said bath during the removal of the substrate. The substrate may be lifted out of the bath and into an enclosure filled with a tensio-active gas, for drying the substrate. Once again, this passive contact with a tensio-active gas is detrimental for efficient and especially for fast drying.

A drawback of many of the existing tools and methods is the necessary footprint, i.e. the surface in the clean room occupied by a tank or a vessel. Tools that work with batches of substrates or which handle individual substrates in a horizontal position tend to occupy a large area in the clean room, which results in high costs, since clean room space is very expensive due to the costs of maintaining an ultra-pure atmosphere.

Document WO-A-99/08057 describes another method and apparatus for drying a substrate. The apparatus comprises a tank. The substrate can be held in the tank by a holder at different holding points. The tank comprises a fluid. The substrate is dried by lowering the level of fluid in the tank relatively to the stationary substrate. A flow of a tensio-active vapor is directed parallel to the substrate and the fluid surface. U.S. Pat. No. 5,571,337 equally describes a method wherein a liquid level is lowered. This lowering of a liquid level relative to a stationary substrate has some disadvantages. Particles removed from the substrate surface will tend to gather near the liquid surface, so a risk appears of contaminating substrates, if the liquid is not replaced in time. Also, if a gaseous environment or flow is used above a stationary liquid surface, this liquid will become saturated with the gas, reducing the drying effect exerted by the gas.

Finally, lowering a liquid is a technique which is unsuitable for the treatment and drying of continuous substrates, such as foils, film, tape or wire.

A final problem in many existing methods and tools is the fact that a droplet of liquid remains attached to the part of the substrate which is last removed from the liquid. To this problem, no satisfactory solution has so far been proposed.

AIMS OF THE INVENTION

The present invention aims to propose a method and apparatus allowing the efficient and fast removal of liquid from both surfaces of a substrate.

In particular, the present invention aims to propose a method and apparatus for liquid removal, including the last droplet.

SUMMARY OF THE INVENTION

The present invention is related to a method for performing a liquid treatment on at least one substrate, including the removal of a liquid from at least one flat surface of said substrate, said method comprising the following steps:
   introducing said substrate in a tank,
   filling said tank with a liquid, said step of filling said tank taking place before or after said step of introducing said substrate,
   performing at least one liquid treatment step on said substrate,
   removing said substrate from said tank in an essentially vertical direction, said direction being parallel to said substrate surfaces that are to be dried, through an opening in the top part of said tank, so that a liquid flow out of said tank is produced between said substrate and said opening during the passage of said substrate through said opening, According to one preferred embodiment, simultaneously with said step of removing said substrate, the step of directing a flow of a gaseous substance at the intersection line between a substrate surface that is to be dried, and said liquid, in such a way that the plane comprising both the speed vector of the substrate movement and of said flow of a gaseous substance is perpendicular to the surface of said substrate that is to be dried.

According to another preferred embodiment, said substrate has parallel flat surfaces, and said flow of a gaseous substance is produced through a narrow opening of a device positioned in such a way that said narrow opening is parallel to said flat surfaces, and wherein the speed, pressure and direction of said flow is equal in each point of said narrow opening.

According to the invention, said gaseous substance is part of the group consisting of a non-heated tensio-active gas, a heated tensio-active gas, a non-heated tensio-active vapor, a heated tensio-active vapor, a heated inert gas, or a mixture of at least two of the preceding gaseous substances.

Secondly, the invention is related to a method for performing a liquid treatment on at least one substrate including the removal of a liquid from at least one surface of said substrate, said method comprising the following steps:
   introducing said substrate in a tank,
   filling said tank with a liquid, said step of filling said tank taking place before or after said step of introducing said substrate
   performing at least one liquid treatment step on said substrate,
   removing said substrate from said tank in an essentially vertical direction, said direction being parallel to said substrate surfaces that are to be dried, through an opening in the top part of said tank, so that a liquid flow out of said tank is produced between said substrate and said opening during the passage of said substrate through said opening, According to a preferred embodiment, simultaneously with said step of removing said substrate, the step of directing a heat supply at the intersection line between a substrate surface that is to be dried, and said liquid, said heat supply being produced along a line perpendicular to the substrate movement, in such a way that the same heat is produced in every point of said line.

According to another preferred embodiment, when said substrate has two parallel flat surfaces, during the removal of said substrate, a flow of liquid takes place between said flat surfaces and the sides of said opening neighboring said flat surfaces, so that in at least one cross section perpendicular to the substrate surfaces, said flow is uni-directional and essentially non-turbulent.

In the method of the invention for cleaning with water and drying a hydrophilic silicon substrate at room temperature, the speed at which the substrate is removed from the liquid is constant and at least equal to 15 mm/s.

The speed at which the substrate is removed from the liquid may also be reduced prior to the moment when the last part of the substrate passes through the opening.

The method according to the invention may further comprise the step of bringing the last part of said substrate that leaves said liquid into contact with an object, in order to remove a last droplet attached to said last part.

The method according to the invention may further comprise the step of holding said substrate after removal from said substrate from said tank, and directing a flow of a gaseous substance essentially parallel to the surfaces of said substrate that are to be dried.

The present invention is equally related to an apparatus for liquid treating and drying at least one flat substrate, in particular a semiconductor substrate, according to the method of the invention, said apparatus comprising:

a tank, said tank comprising in its wall at least one hole and comprising at least one opening in a top section of said tank, said opening allowing the passage of said substrate in a direction parallel to the plane of said substrate, said tank on the outside further comprising a gutter and a drain, the gutter on at least a portion of the tank (and in one embodiment surrounding the tank), the drain connected to said gutter, means for moving said substrate into said tank, and means for moving said substrate out of said tank through said opening in a substantially vertical direction.

The apparatus may further comprise a means for directing a flow of a gaseous substance at at least one intersection line between a substrate and a liquid present in said tank, as said substrate is moved out of said tank through said opening, said flow having essentially the same speed and pressure in every point along said intersection line.

Alternatively, instead of said means for directing a flow of a gaseous substance, an apparatus of the invention may comprise means for directing a heat supply at at least one intersection line between said substrate and a liquid present in said tank, as said substrate is moved out of said tank through said opening, said heat supply having essentially the same intensity in every point along said intersection line.

In an apparatus according to the invention, wherein one substrate is treated, the sides of said opening are preferably parallel to said substrate and the width of said opening is at least twice the thickness of said substrate.

In an apparatus according to the invention, the top part of the tank forms a converging channel wherein a liquid may flow out of the tank and towards said opening.

Said means for directing a flow of gaseous substance may comprise at least one nozzle producing said flow of gaseous substance through a narrow slit which is essentially parallel to said intersection line and whose length is at least equal to that of said intersection line.

An apparatus according to the invention may further comprise a container placed above said tank, said container comprising an opening at its bottom, i.e. facing said opening of said tank, so that a substrate can move along a straight line from said tank to said container through said openings, said container further comprising at least one inlet opening for letting in a flow of a gaseous substance.

Preferably, in said last embodiment, a first gaseous substance is introduced in said container through at least one first hole in the top part of said container and wherein a second gaseous substance is introduced through at least one long and narrow opening in the lower part of at least one side wall of said container, said long and narrow opening being pointed downwards, i.e. in the direction of the tank, and wherein the part of the container under said at least one long and narrow opening forms a channel with a converging width, as seen in a cross section perpendicular to the center line of the openings through which the substrate moves.

An apparatus using a gas flow for drying may further comprise an exhaust channel for removing said gaseous substance from said intersection line between said substrate and said liquid. The sides of said exhaust channel may be sealed off from the surrounding atmosphere.

According to another embodiment, said substrate may be flexible and continuous, and said tank may then comprise at least one transporting device, such as a roller, for transporting said flexible substrate through a liquid inside said tank. In this embodiment, the substrate may be a film, foil, tape or wire.

According to an embodiment of the invention, an apparatus is proposed using the method of the invention for treating and drying a batch of parallel flat substrates and comprising a tank, at least one gutter, and at least one drain, wherein said liquid flows out of said tank only between the short edges of said substrates and the neighboring sides of said tank.

An apparatus according to the invention may further comprise means for removing a last droplet attached to the last part of said substrate that leaves said liquid, said means for removing a last droplet being chosen from the group consisting of:

At least one fiber attached to the top part of said tank,

At least one piece of foam attached to the top part of said tank.

BRIEF DESCRIPTION OF THE DRAWINGS

FIG. 1b shows an enlarged detail of the apparatus of FIG. 1a.

FIGS. 6a to 6d illustrate apparatuses according to the invention for treating and drying a batch of substrates.

DETAILED DESCRIPTION OF THE INVENTION

The present invention is firstly related to a method for liquid treating and drying a substrate. In one of the preferred cases, this substrate is a semiconductor wafer. It can also be a glass slice, a foil or film or tape, or even a wire. The treatment comprises one or more steps whereby the substrate is immersed in a liquid present inside a tank. Possibly, several of such steps, e.g. cleaning or etching, are performed while the substrate remains inside said tank, while the tank is consecutively filled with a number of treatment liquids.

Figure 1A:
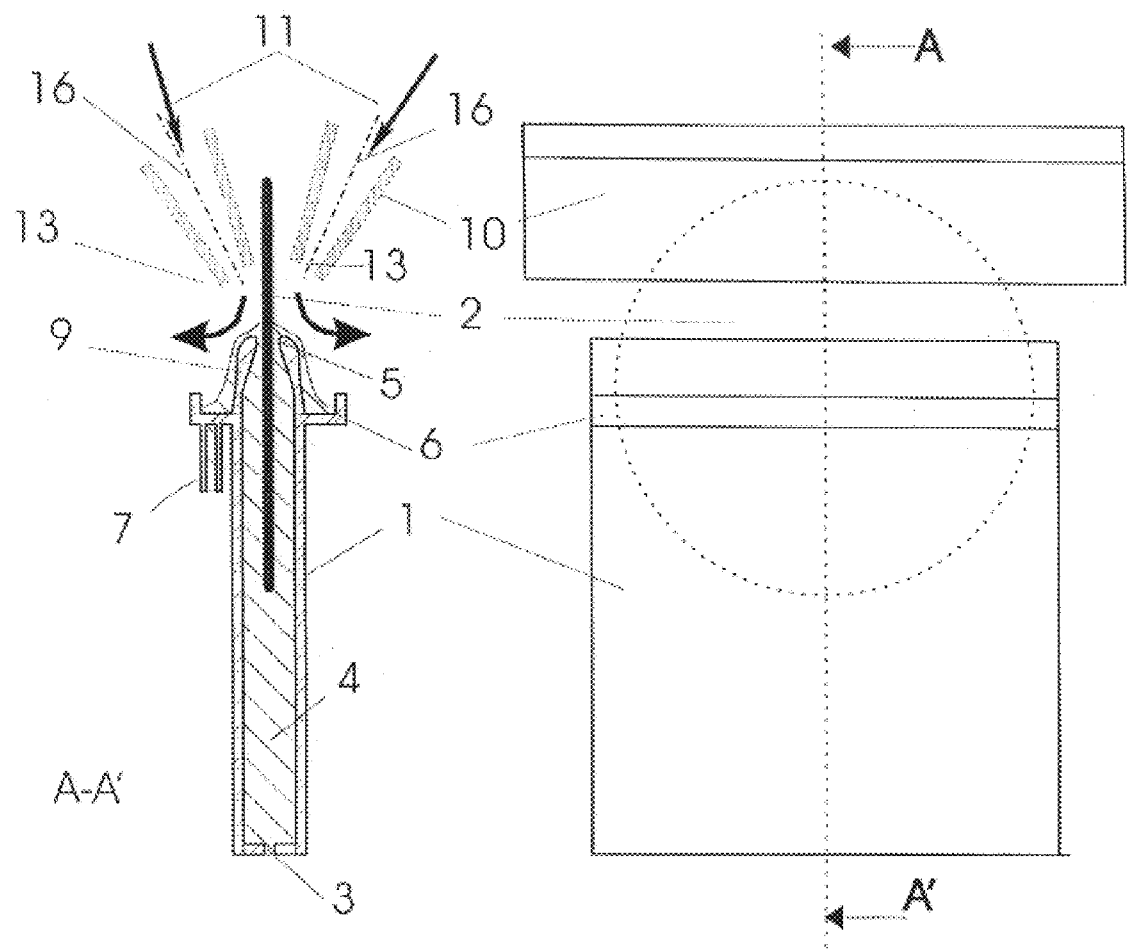
FIG. 1a represents a schematic view (vertical cross-section and plan view) of an apparatus used to remove a liquid from the surfaces of a flat substrate according to a first embodiment of the invention.

A preferred embodiment of such a tank 1 for treating and drying a single flat substrate, according to the invention is shown in FIG. 1a. This particular tank is essentially flat and has a narrow opening or 'slit' 5 at the top. As a first step of the method, the substrate is then introduced in this tank. This may be done by lowering the substrate through said slit 5. Alternatively, the tank may possess a similar opening at the bottom through which the substrate may be introduced. Other ways of introducing a substrate in the tank 1 are within the scope of the present invention.

Figure 1B:
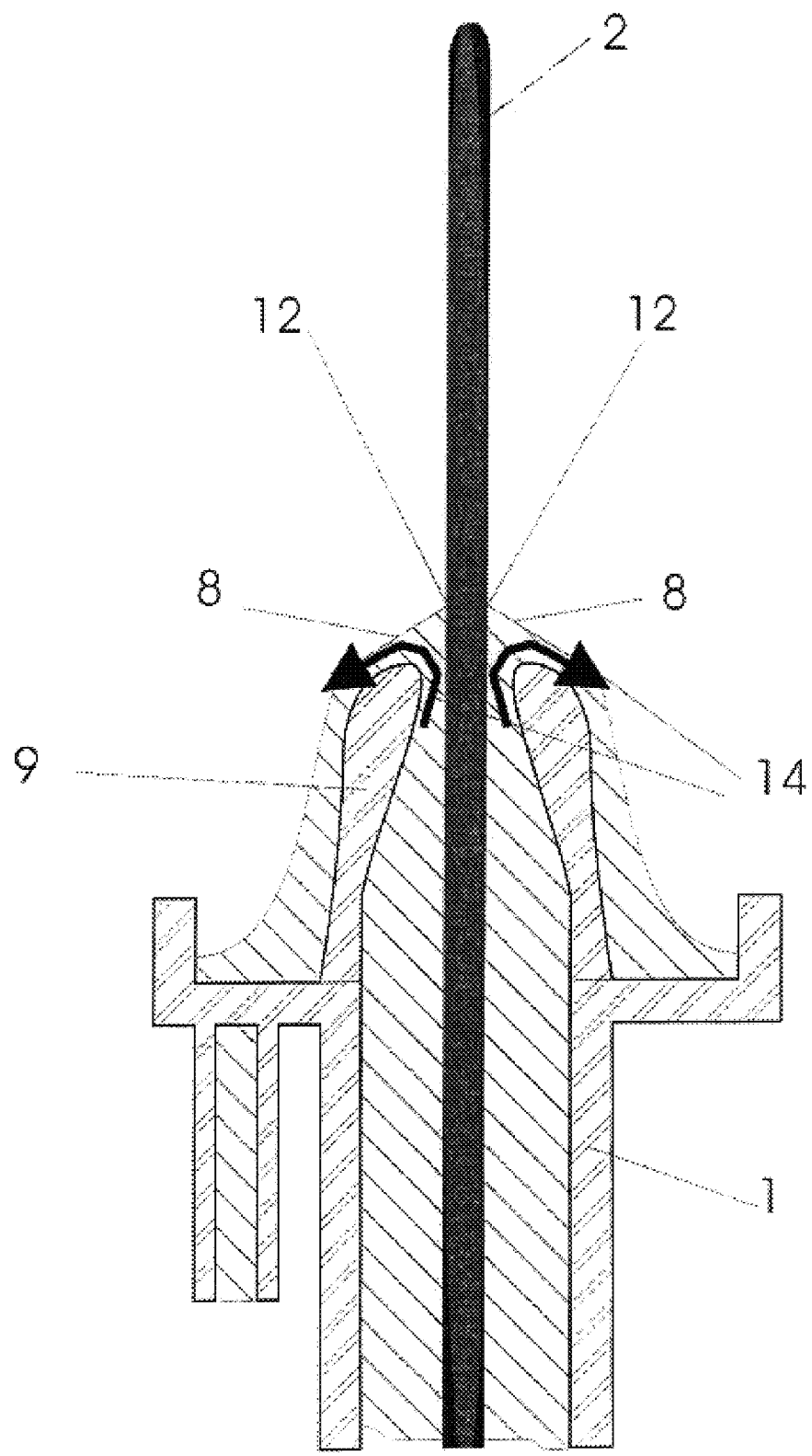

Once the substrate 2 has undergone at least one liquid treatment step (e.g., wet etching step, wet cleaning step or wet rinsing step), it is to be removed from the tank and dried, i.e. all remaining liquid is to be removed from the substrate's surfaces. The way this drying is done forms the characteristic part of the present invention. With a suitable mechanical lifting device, the substrate is lifted up and moved through the slit 5, in a direction parallel to the surfaces that are to be dried. In the embodiment of FIG. 1, this slit is sufficiently narrow so that liquid overflows from the tank while the substrate is moving through the slit. The result is that a liquid surface 8 (see detail in FIG. 1b) is formed outside the tank 1 and a clear intersection line 12 develops between the substrate 2 and said overflowing liquid's surface 8. Characteristic to this embodiment is the fact that there is a unidirectional flow 14 in those parts of the opening's 5 cross section between the tank edges and the moving substrate, see FIG. 1b. This prevents the build-up of particles in the opening and avoids a stagnant liquid surface that may become saturated by tensio-active gas. The form of the tank's cross section leading up to the opening 5 is designed in a convergent way, so that the liquid flow is non-turbulent, resulting in a steady and uni-directional flow of liquid throughout the removal step.

The drying is then obtained by causing a tensio-active effect or surface tension gradient (STG), i.e. a local reduction of the liquid's surface tension at the edges of the liquid body, to take place in every point along the length of this intersection line 12, and preferably on the intersection lines 12 on both sides of the substrate.

According to a first embodiment, this is done by a uniform flow of a gaseous tensio-active substance, directed at the intersection line 12. Characteristic to the invention is the fact that the plane containing both the speed vector of this flow and of the substrate movement is perpendicular to the surface to be dried. This is the plane of the drawing in FIG. 1, the gas flow being indicated by reference 11. In the case of flat substrates, this flow is produced by a suitable device such as the nozzles 10, through narrow openings 13, which are parallel to the substrate surfaces. The flow produced through these openings has the same speed, pressure and direction in every point of the narrow openings 13, hence the word 'uniform'. Likewise, the speed of the flow is equal in every point along a line on the substrate, parallel to the slit 13. The intersection line 12 preferably falls together with such a line parallel to the slit 13, and forms a straight 'drying front', i.e. a clear separation line between wet and dry surface.

The gas can be heated so that its temperature is higher than that of the liquid. A uniform gas flow as described above is beneficial for the drying process: a sufficient gas velocity enhances the transfer of tensio-active species from the gas flow to the liquid at the drying front.

The possibilities for the gas composition and the means to supply it are explained further in the text. In one embodiment, long nozzles 10, such as shown in FIG. 1a, are amongst the preferred embodiments. The drying method as described is applied on both sides of the substrate in the preferred case. However, the method may be applied to just one side, if required.

According to a second embodiment, the surface tension gradient is obtained by a heat supply directed at the intersection lines 12, heat being supplied along a line which is perpendicular to the substrate movement and parallel to the substrate in case of a flat substrate 2.

Such a heat supply is produced by a suitable source, for example a hot filament, along a line parallel to the substrate's flat surfaces. The heat produced is the same in every point of said line, so that the heat supply and subsequent tensio-active effect is equally uniform, and able to create a straight drying front.

The gas flow and heat supply described above may be combined. According to another embodiment, the tensio-active effect might differ along the drying front. This might be done by supplying a gas flow with a redefined speed profile along the length of the slit 13. In all cases however, the flow speed remains in a plane perpendicular to the surfaces to be dried.

Thanks to the uniform drying technique, the speed of the drying process of the invention may be increased compared to existing methods. The speed and pressure of the drying gas flow can readily be adapted so that at a required high removal speed of the substrate, an efficient drying process is ensured.

The method preferably further comprises an additional step wherein the last remaining liquid attached to the substrate after the drying step, is removed through evaporation. For this purposes, the substrate is held stationary for a period of time. This can also be done by bringing the stationary substrate into contact with a gas flow, preferably a heated gas flow, which is parallel to the substrate surface. Also a last step may be added, whereby a droplet is removed from the last part of the substrate that leaves the tank, by bringing said last part in contact with an object, such as a fiber or a piece of foam.

Figure 6A:
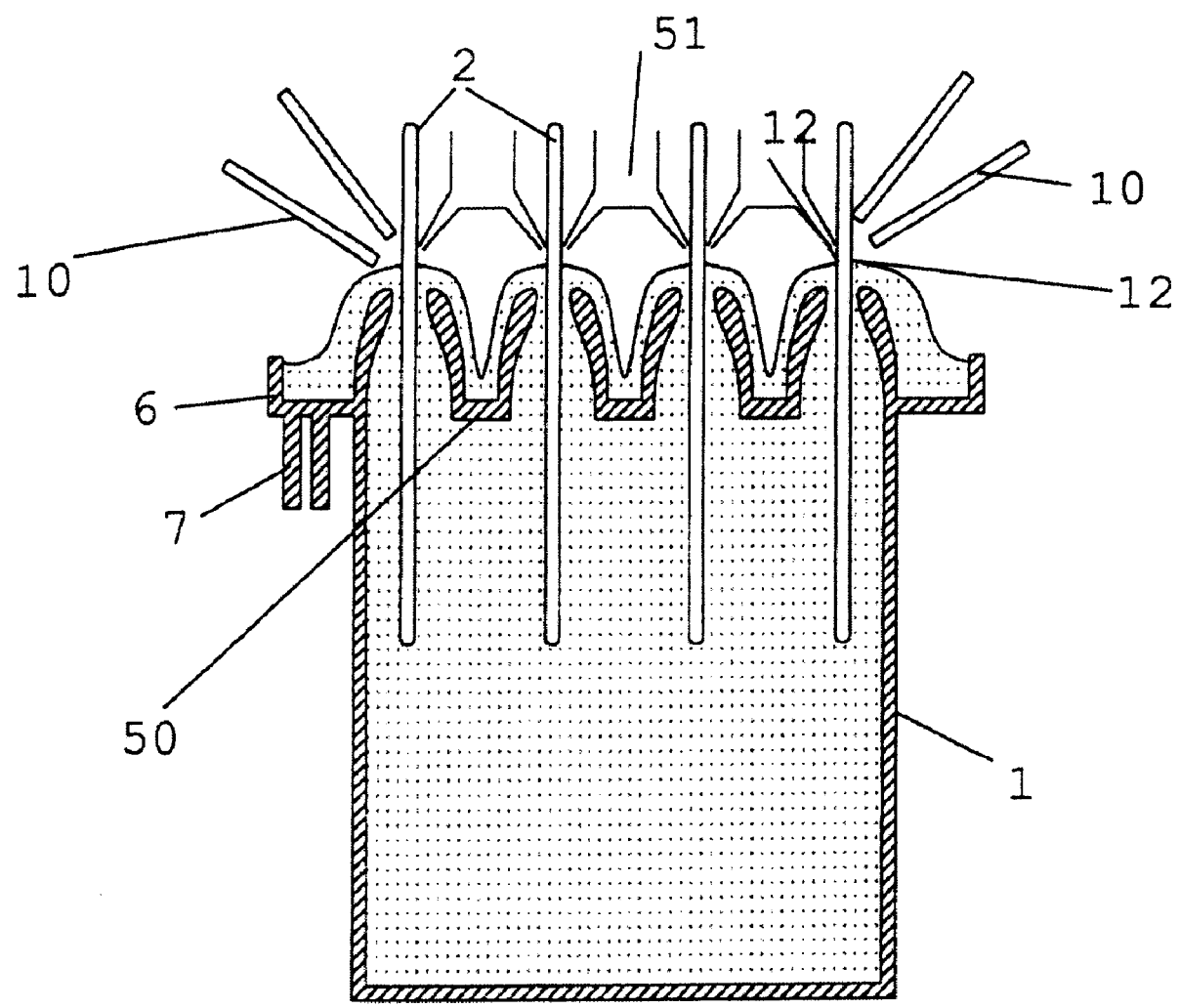

The method can be applied to a batch of parallel substrates immersed in one tank, said tank having a number of openings 5, see FIG. 6a. The method described above is applicable to every individual substrate in such a batch.

Figure 6B:
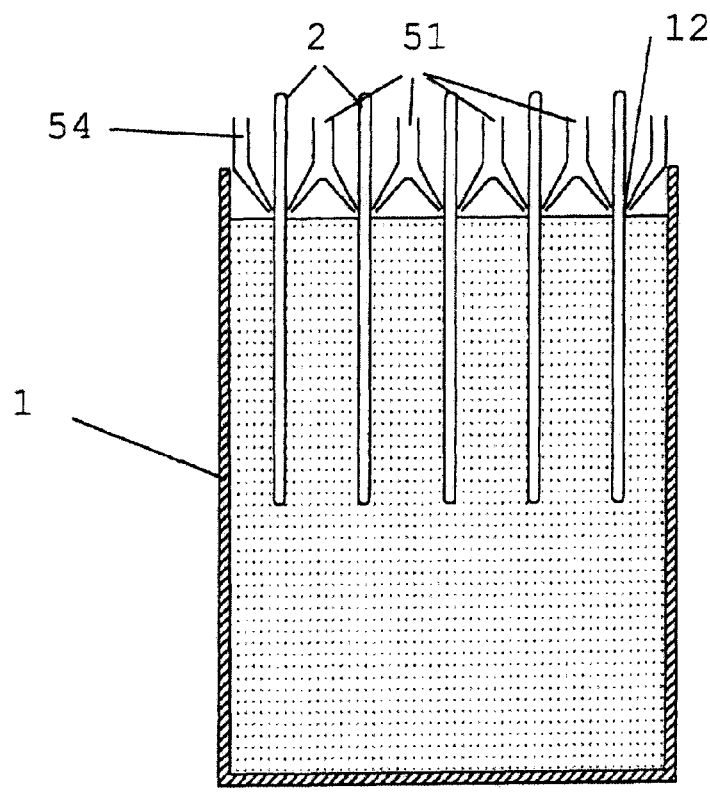
Figure 6B:
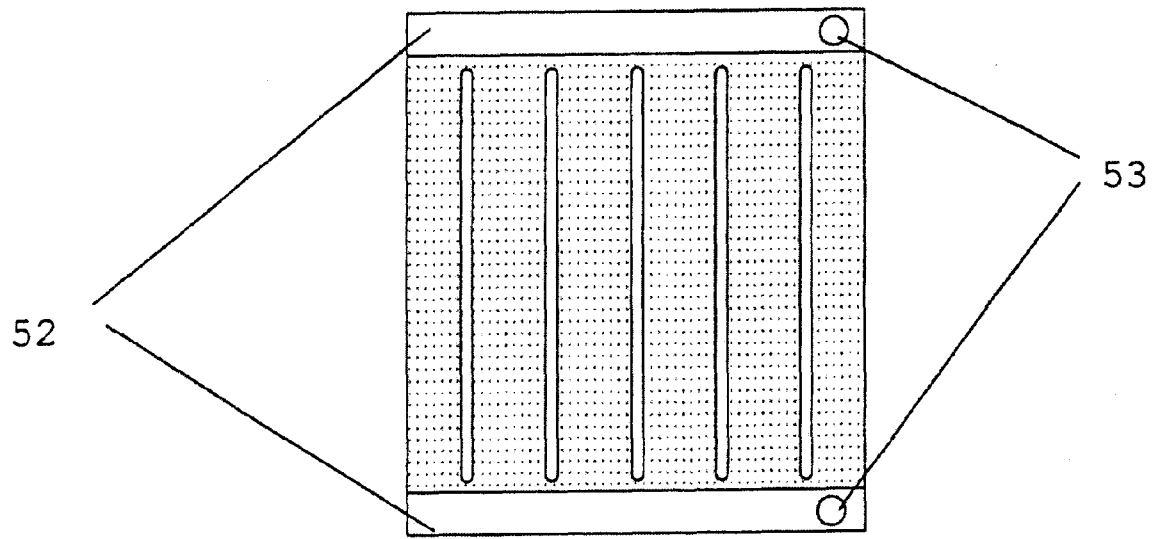

According to a last embodiment of the method of the invention, the method may be applied to a flat substrate or preferably a batch of substrates, while no overflow takes place between the flat surfaces of the substrate(s) and the neighboring sides of the tank, but only between the edges of the substrate and the tank (see FIG. 6b). The method applies, as long as a uniform surface tension reduction takes place at all the intersection lines 12 between substrates and liquid. The only difference with previous embodiments is that no overflow takes place at these intersection lines. The STG is then performed by the same means (gas flow and/or heat supply) as previously described.

FIG. 1a shows a vertical cross section and frontal view of an apparatus for treatment of a single substrate according to a first embodiment of the invention. FIG. 1b is an enlargement of a portion of the vertical cross section of FIG. 1a. The apparatus comprises a flat tank 1, which is preferably capable of containing a substrate 2 in its totality. The tank 1 comprises at least one hole 3, through which it may be filled with a liquid 4. At the top of the tank is a slit 5, which is a narrow opening broad enough to allow the passage of the substrate 2, as illustrated. The length of the slit 5 is sufficient to let a substrate pass through. All around the tank, a gutter 6 is present, from which a drain 7 extends. The liquid 4 can be any type of cleaning or rinsing solution, an etching liquid or any other processing liquid known in the art.

As the substrate is pushed and/or pulled out of said tank 1, liquid is allowed to flow out of the tank, into the gutter 6. The tank is designed in order to have a low turbulence liquid flow through the slit 5, creating a liquid surface 8 in the vicinity of the substrate. This is optimized by the particular shape of the top part 9 of the tank, as seen in a cross-section perpendicular to the substrate surface, such as shown in FIGS. 1a and 1b. In this top section 9, the width of the tank is gradually reduced to the width of the opening 5. This converging width is designed so as to maintain a non-turbulent and uni-directional flow, described above. In the preferred embodiment, the slit 5 has parallel sides, and the width of the slit is at least twice the thickness of the substrate 2. This width is generally larger than in prior art devices which allow no overflow, thereby solving some of the problems related to such existing devices: bow phenomenon, etc. . . .

To compensate for the overflow of liquid, a supply of liquid to the tank is available, e.g. through the hole 3 or through other holes (not shown) in the tank 1. The liquid that appears at the top through the slit 5 is collected in the gutter 6 and removed by the drain 7.

Means 10 are provided to direct a uniform flow 11 of a gaseous substance—on each side of the substrate—towards the drying front 12, which is the intersection line between the substrate 2 and the liquid's surface 8, as the liquid overflows from the tank.

The gaseous substance, or 'drying ambient' may consist of a variety of substances including, but not limited to:
a tensioactive vapor or gas, e.g. IPA
an inert gas (or vapor)
or a mixture of both or a mist. The gas may be heated in order to enhance the surface tension gradient, i.e. $T_{gas} > T_{liquid}$. This effect is caused either by a local rise in the concentration of a tensio-active gas such as IPA vapor in the liquid, and/or by a very local heating of the liquid, said local rise and/or local heating taking place at the edges of a mass of liquid attached to a surface, so that the removal of said mass of liquid from said surface is facilitated. A heated inert gas may be used to acquire the heat induced effect. A heated tensio-active gas may be used to acquire a combination of both means to induce the tensio-active effect. Finally, a heated mixture of tensio-active and inert gas may be used.

The means to direct the gas flow are such that, in one embodiment, uniform flows of gas are directed at the drying fronts 12 between the liquid surface 8 and the substrate 2, meaning that the gas flow has the same speed and direction at each point of a straight drying front. This uniform flow may be accomplished in a variety of ways. For example, to produce these flows, nozzles 10 may be used, which produce the flow in the vicinity of the drying front 12, through narrow slits 13 parallel to said front 12 and having at least the length of said front 12. In every point of the slits 13, the speed, pressure and direction of the produced gas flow are equal. The gaseous mixture should arrive at the drying front 12 with sufficient speed, so that an efficient transport or transfer of the mixture to the liquid at the drying front can take place. The main advantage of this type of flow is that it takes place in a uniform way across the entire drying front. This means that at every point along the front 12, the drying action of the gas will be the same, leading to a very efficient drying process. This allows to increase the speed at which the substrates are moved out of the tank, and hence the overall process speed. For a hydrophilic silicon substrate, taken from a tank of the invention, filled with water at room temperature, the speed at which the substrate is removed is at least 15 mm/s.

The gas supply rate for such a substrate, 20 cm in diameter, is 5 standard liter per minute, through a slit 13 of 1 mm in width.

The angle between the nozzles' center lines 16 and the plane of the substrate is such that an optimal mixing of the gaseous mixture and the liquid is obtained. Other geometrical aspects of the nozzles 10 other than the slits 13, may alter without leaving the scope of the present invention.

Figure 2:
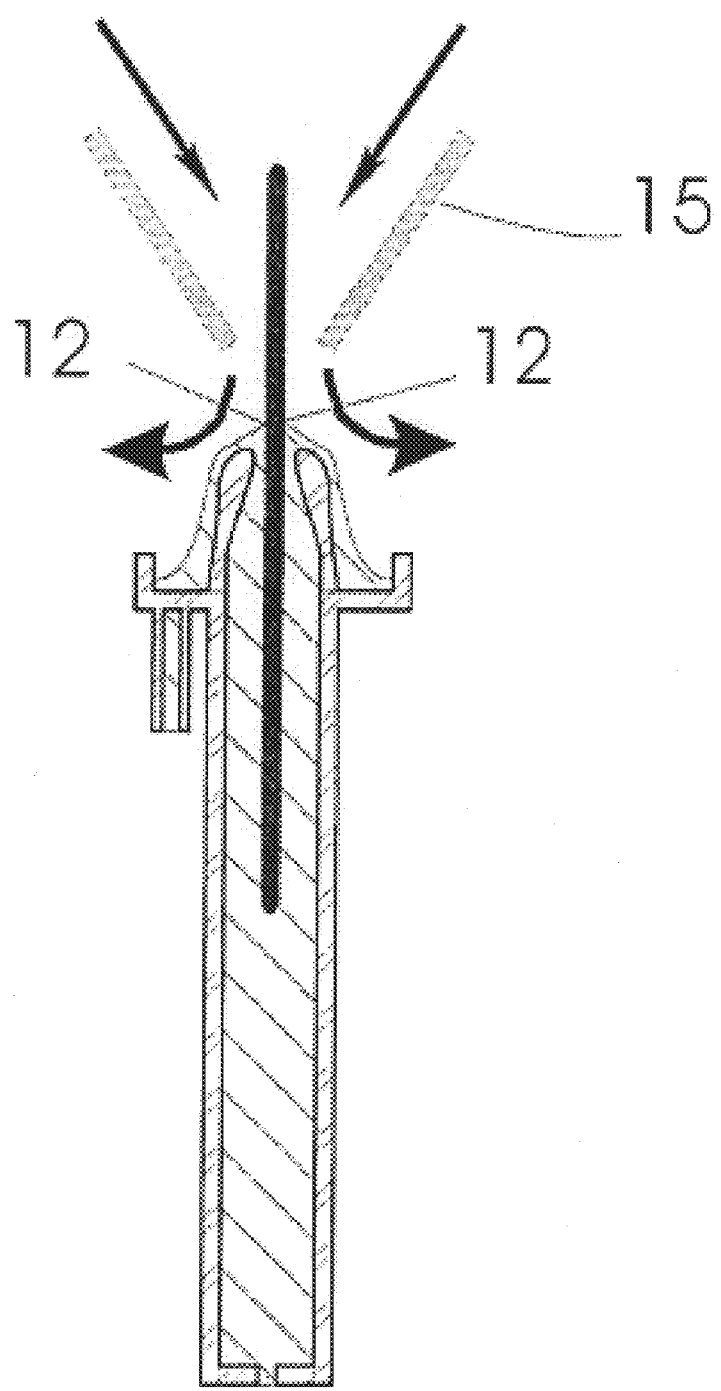
FIG. 2 represents an alternative supply of gas towards a substrate, in an apparatus according to one embodiment of the invention

FIG. 2 shows an alternative means for supplying the drying ambient. In this apparatus, two tilted side walls 15 guide the uniform flow of drying ambient towards the drying fronts 12.

Figure 3:
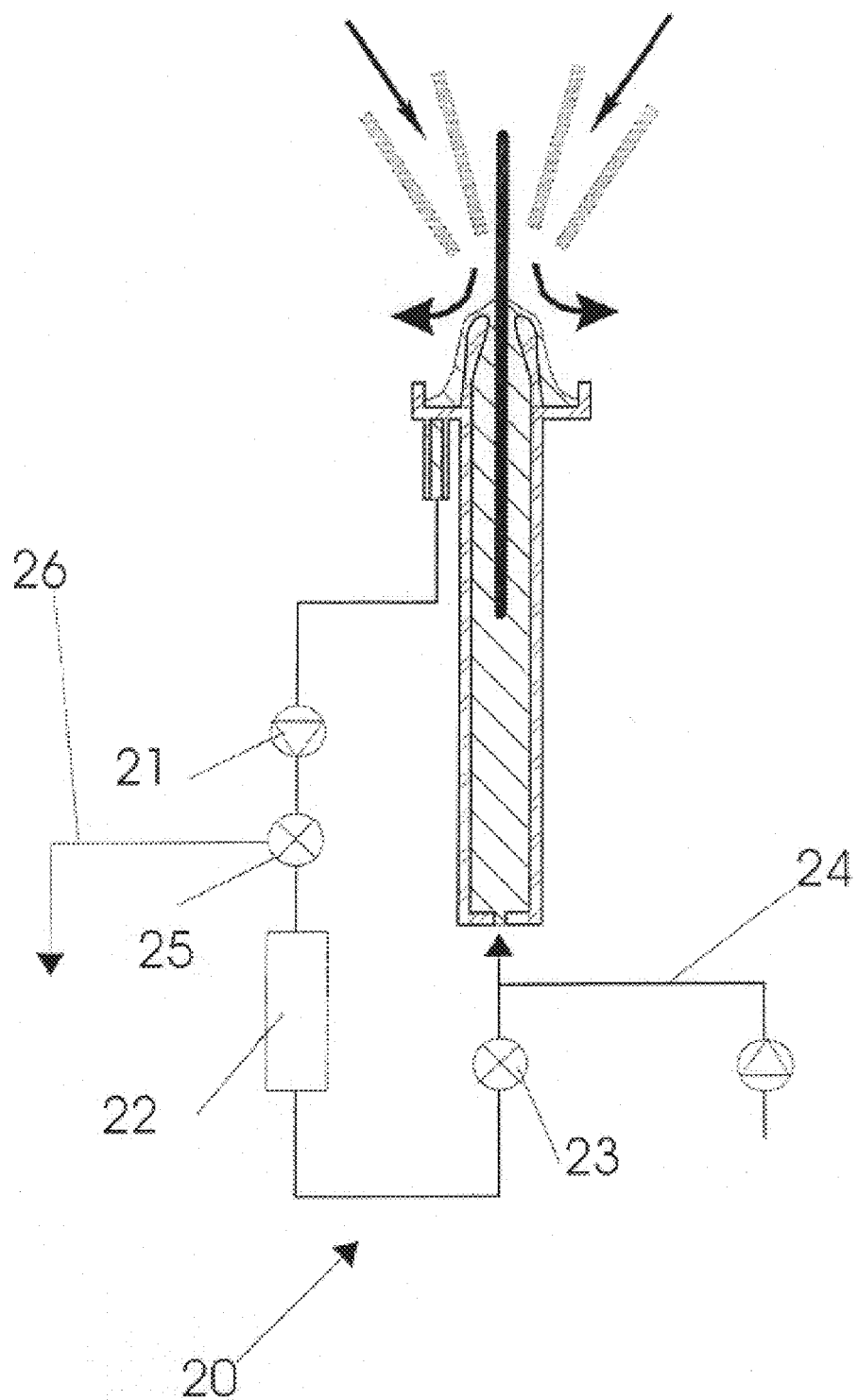
FIG. 3 represents a liquid circuit in connection with an apparatus according to one embodiment of the invention.

FIG. 3 shows a possible set-up of a liquid circuit 20 connected to the apparatus of the invention. This circuit comprises a pump 21, a filter 22, and a valve 23. The filter removes particles from the liquid after which said liquid flows back to the tank 1 to be re-used. Such a circuit preferably accompanies a separate supply of fresh liquid 24, which ensures that the level of the liquid surface 8 remains stationary. A valve 25 is preferably present to regulate the amount of liquid that is recuperated and the amount that is diverted towards a drain 26. The recovery of liquid by the circuit 20 may be undesirable for certain processes wherein no contamination whatsoever of the cleaning liquid is allowed. In that case, the overflowing liquid would flow into a drain or a separate waste collection tank, without being recirculated. A recirculation circuit such as the circuit 20 may be added to any of the embodiments according to the present invention.

Figure 4:
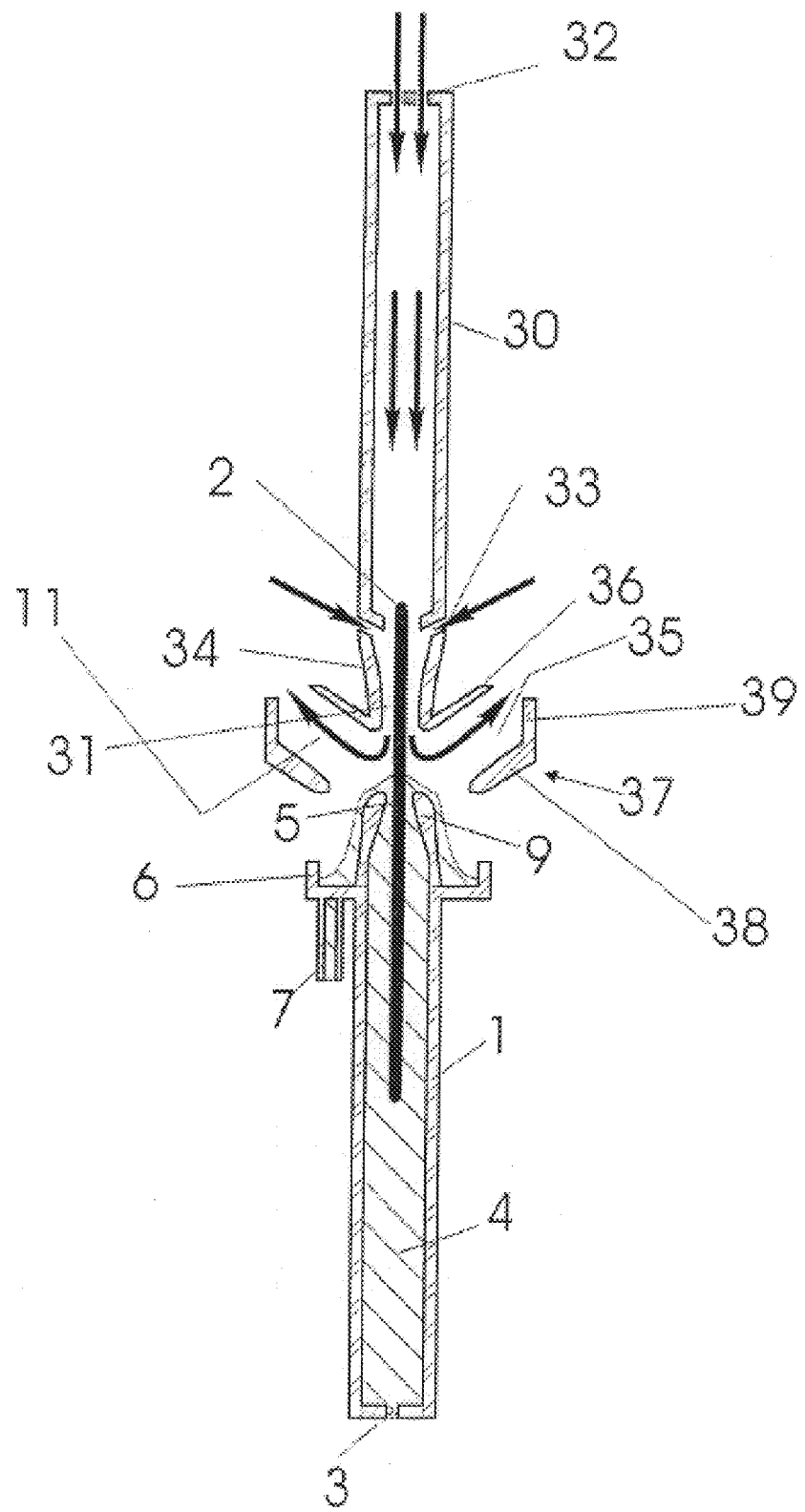
FIG. 4 represents a schematic view (vertical cross-section) of an apparatus according to a second embodiment of the invention.

FIG. 4 shows another embodiment of an apparatus according to the invention. It comprises the same tank 1 as in the previous embodiment. Now however, a container 30 is placed directly above the first tank. This container has a narrow opening 31 at the bottom through which the substrate can enter. The drying ambient is injected through one or more holes 32 at the top of this container 30. In addition, drying ambient of the same or of other composition is injected through the walls of the container 30, preferably through long inlets 33 placed near the bottom of the container 30 and pointing downwards so that the gas flowing through these inlets 33 directs the flow downward. The flow through the inlets 33 should be uniform for the whole of the drying fronts 12, as described for the previous embodiments. The portion 34 at the bottom of the container 30 is preferably converging towards the opening 31 to obtain a smooth and stable flow of drying ambient through the opening 31 and towards the drying front 12 between the liquid surface and the substrate surface. Once the last part of the substrate has passed the inlets 33, the gas flow through these inlets 33 and/or 32 can be switched off. The substrate can then be held temporarily in the upper tank 30.

This set-up with double injection (through openings 32 and 33) of drying ambient allows to create in the upper tank an environment with very low concentration of the vapors of the liquid to be removed, resulting in fast "evaporation" of the very small amount of liquid potentially adsorbed on the surface or present in microscopically small trenches even after macroscopic removal of the liquid from the substrate. This evaporation step then takes place while the substrate is held stationary in the container 30.

Alternatively, the gas flow through the top openings 32 may be maintained while the substrate is held in the upper tank. The flow of gas parallel to the substrate then helps to remove the last remaining liquid adsorbed to the surfaces.

Preferably, at the top inlets 32, a relatively hot mixture ('hot' being with respect to the liquid) of an inert gas, e.g. $N_2$ without any or with very little tensioactive vapor is injected, while at the lower inlets 33 a less heated mixture of an inert gas, e.g. $N_2$ with a higher concentration of tensioactive vapor is injected.

On both sides of the opening at the top of the lower tank 1, and surrounding the tank 1, an exhaust channel 35 can be provided to remove the drying ambient from the drying fronts 12. In the embodiment of FIG. 4, the exhaust channel is formed by an extension 36 of the container, and a structure 37 surrounding the tank, and having one tilted side wall 38 and one vertical side wall 39, to guide the gas flow 11 away from the drying fronts 12.

Figure 5:
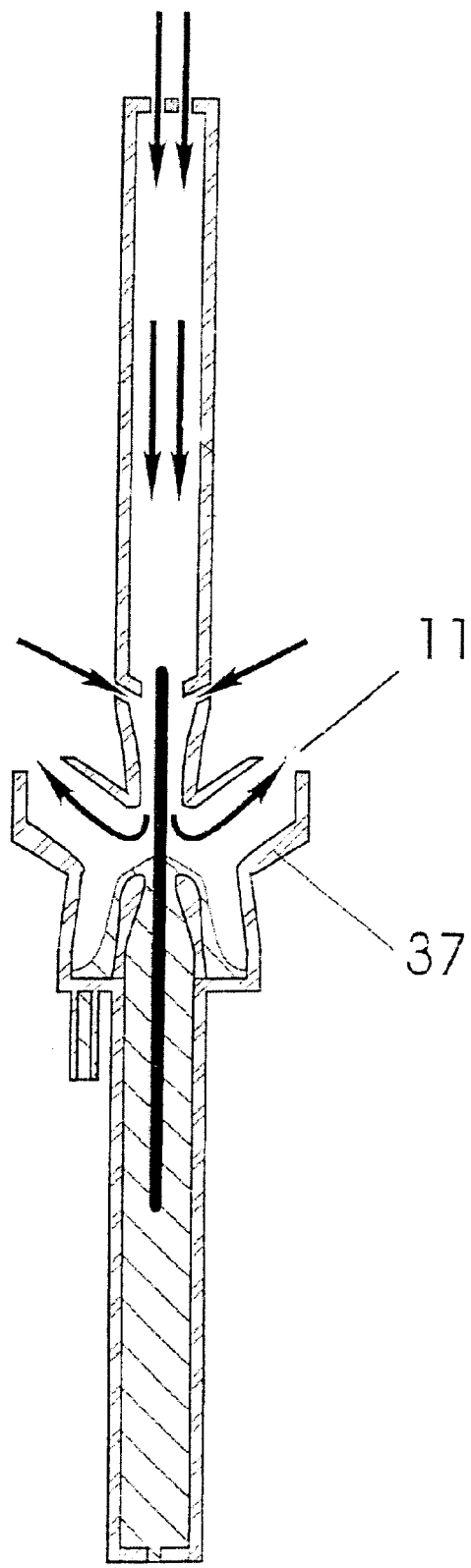
FIG. 5 represents an apparatus according to the invention wherein the drying process is sealed from the atmosphere.

FIG. 5 shows another embodiment, wherein the drying fronts 12 are sealed off from the atmosphere. In the apparatus shown, the structure 37 is fixed to the tank 1, as an extension of the gutter 6. This device allows no mixture of the gas flow with the atmosphere, as was possible in the previous embodiment through the side opening between the gutter 6 and the structure 37.

Some materials such as bare Si suffer from the formation of drying marks, which is a consequence of an oxidizing agent, mainly $O_2$ originating from the atmosphere and entering the treatment liquid in which the substrate is immersed. This causes the formation of etching agents, such as $SiO_2$. The danger is that these etching agents become trapped with minute amounts of liquid in microscopic trenches of the surface after the drying process. When finally, these last amounts of liquid are removed by evaporation, the etching agents leave small marks on the surface. The set-up of FIG. 5 allows to minimize the contact between the atmosphere and the liquid in the tank 1, if a sufficient speed and pressure of the gas flow 11 is maintained.

The complete apparatus may equally be placed in an enclosure wherein the pressure is low or zero or wherein the partial pressure of an oxidizing species is close to zero, to further ensure that no oxidizing agents can reach the treatment liquid. The gas pressure and speed of the flow 11 should be sufficient in this case to maintain a stable liquid surface 8. Advantageously, this embodiment equally enables the use of toxic or dangerous chemicals either as the liquid or in the drying gas mixture. The embodiment of FIGS. 1 and 2 may have the same type of exhaust fixed to the gutter 6. All apparatuses according to the present invention may be placed in a low pressure or zero pressure or partial pressure environment, or in a strictly inert ambient.

The tank 1 can be equipped with temperature control (either heating or cooling) and transducers producing mechanical vibration of high frequency often referred to as "Megasonic" (e.g. 1 MHz range), in order to reduce the residual particle concentration on the substrate and/or on the tank walls.

The movement of a substrate relative to an apparatus as described in the above embodiments need not necessarily take place in a vertical plane. The apparatuses may be tilted over a given angle. The only condition that needs to be met is that an overflow of the liquid and subsequent evacuation of said liquid needs to be possible, putting a limit on the tilt angle.

FIG. 6a shows an apparatus according to the invention capable of treating and drying several parallel substrates, i.e. a batch of substrates. The top of the tank comprises a row of openings 5 which are analogous to the openings in single substrate devices of the invention. The overflowing liquid produced between the substrates is collected in the intermediate gutters 50 which are in connection with the drain 7. Double nozzles 51 are present in between two substrates, in addition to the nozzles 10 at the sides of the tank, so that uniform flows of drying ambient are provided to all the drying fronts 12.

The apparatus shown in FIG. 6b is different in that it allows the immersion of several flat and parallel substrates 2 in one liquid tank 1, without intermediate gutters. The overflow takes place between the short edges of the substrates and the sides, into gutters 52 and further into the drains 53. A single gutter might be used, surrounding the whole of the tank 1, but no overflow takes place over the edges of the tank which are parallel to the substrates. A uniform gas flow according to the invention is directed at every intersection line 12 between the substrate surfaces to be dried and the liquid. At these intersection lines, no overflow takes place in this embodiment. Here also, double nozzles 51 are placed in between two substrates, as well as single nozzles 54 at the sides. Some variants of the nozzles 51 are shown in FIGS. 6c and 6d.

Figure 7:
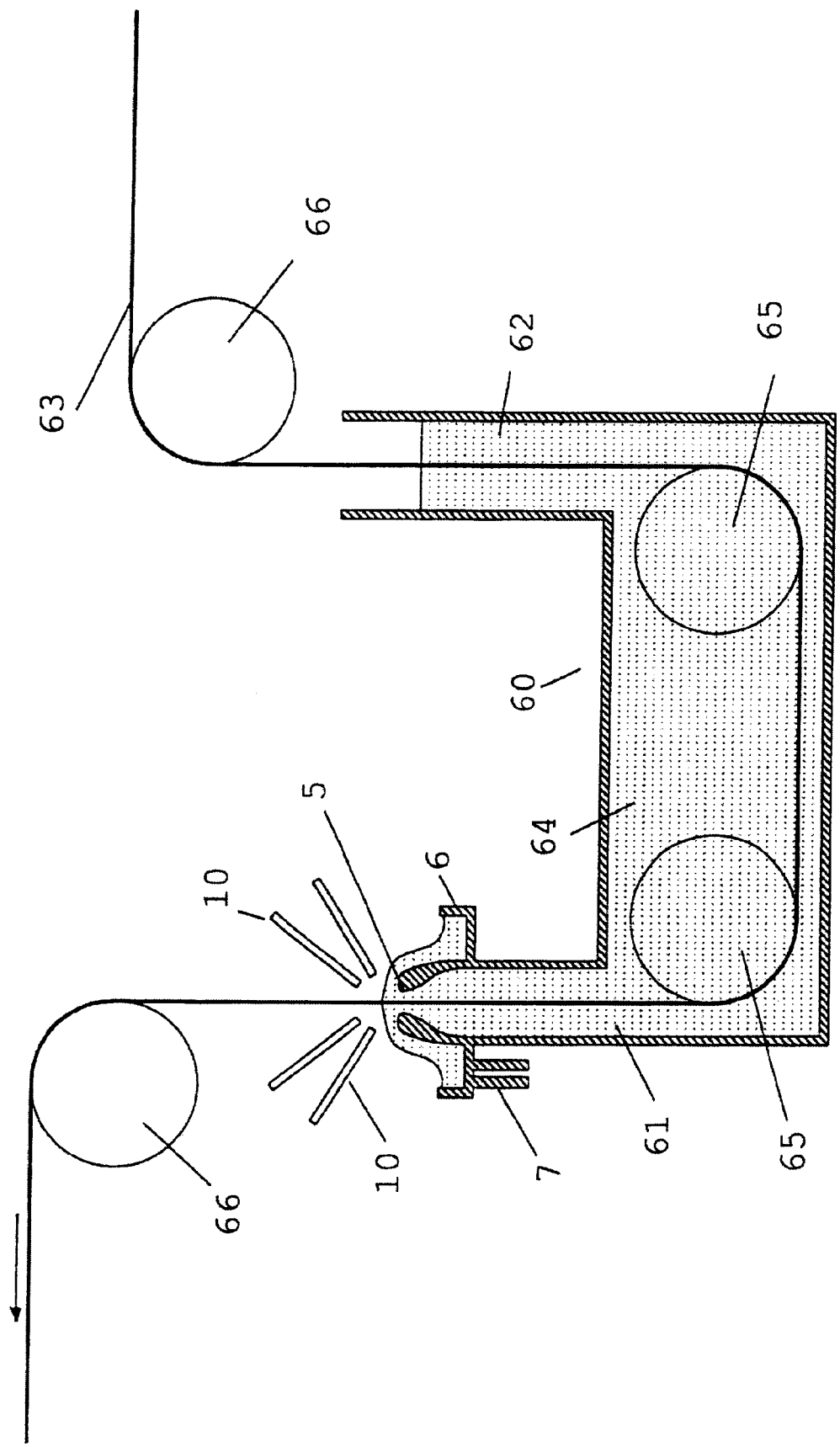
FIG. 7 represents an apparatus according to the invention, for treating and drying a continuous foil-like substrate.

FIG. 7 shows another embodiment of the invention, which is to be used for the treatment of continuous flexible substrates, such as films, foils, tapes or even wires. The tank 60 consists of two vertical legs 61 and 62. The top part of the leg 61 is similar to the top part of the tank 1 of previous embodiments, except that the width of the opening 5 is adapted to the width of the flexible substrate 63. Between the vertical legs 61 and 62, the tank 60 has a horizontal part 64. The tank 60 is equipped with a system of guiding device, e.g. rollers 65 placed in said horizontal part 64. Rollers 66 outside the tank, working in synchronicity with the immersed rollers 65 ensure a continuous movement of the substrate 63 through the opening 5 at the top of the leg 61. Nozzles 10 are present for supplying a uniform flow of drying ambient towards the drying fronts on both sides of the substrate. A gutter 6 and drain 7 are present, just as in previous embodiments. A container 30 may be installed instead of the nozzles 10, analogous to the embodiment of FIG. 4. The tank 60 is filled by filling up the right leg 62, where a stable liquid level may be maintained, possibly with the help of level sensors or the like. This apparatus has the advantage that the fluid column in leg 62 allows an easy control of the level and pressure of the treatment liquid inside the tank 60. The rollers 65 could advantageously be replaced by liquid bearings to avoid friction between the rollers and the substrates. Such a liquid bearing might use the liquid 4 itself which would be circulated from the inside of the bearing to the outside through holes along the bearing's circumference, thereby maintaining the substrate at a fixed distance from the bearing's outer surface, and so avoiding direct contact and friction. Such friction may be the cause of particle generation. This apparatus may be used to clean and dry a row of parallel wires.

In any one of the embodiments disclosed so far, the drying ambient was formed by gas flow, heated or not. Alternatively, according to the invention, the drying effect may be acquired by a heat source capable of very localized heating, in the region near the intersection line between a flat surface and a body of liquid present on said surface. Therefore, in stead of the nozzles 10 or 51, or the inlets 32 33 in the container 30, heat sources such as lasers or heat filaments may be placed on both sides of the tank, providing a uniform heat supply to the drying fronts 12. These heating means may be combined with the use of tensio-active gases or used as such. The heat sources should produce the same amount of heat in every point of a line parallel to the substrate surface.

Figure 8:
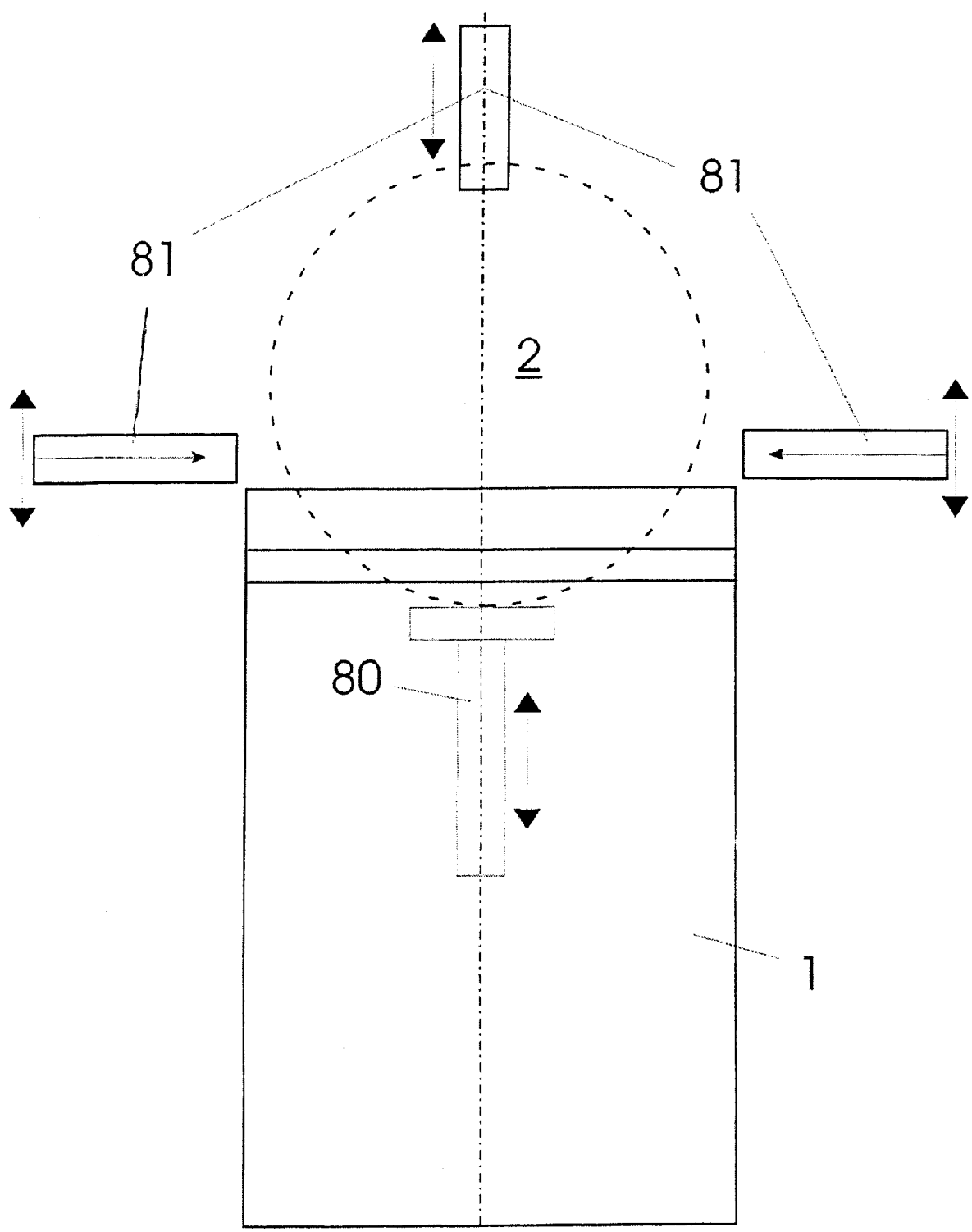
FIG. 8 represents a mechanism according to the invention for moving a substrate through an apparatus of the invention.

The substrate may be moved into and out of the tank in a variety of ways. FIG. 8 shows a preferred embodiment of the mechanism used for moving a single substrate into and out of the opening 5 on top of the tank. A similar mechanism can be used for a batch of substrates. A support 80 is used underneath the substrate and inside the tank 1, in combination with a gripper device comprising three grippers 81. The support 80 pushes the substrate out of the tank 1. At a predefined position of the substrate, the latter is then gripped by the grippers 81 and pulled further out of the tank. The two grippers that are placed sideways of the substrate can move left to right (see arrow). They move inwards at a moment when more than half of the substrate has left the liquid bath. Preferably at the same time, the top gripper moves downward (see arrow) to grip the top of the substrate. Both the support 80 and the three grippers 81 (together) can move vertically (or essentially vertically) up and down to produce an upward (or essentially upward) movement of the substrate at a constant or variable speed. The grippers and support can equally be used for lowering a substrate in the tank. In one embodiment, the angle of the substrate may be 10° degrees from vertical (i.e., between 80° to 100°, if 90° is considered vertical).

Figure 10:
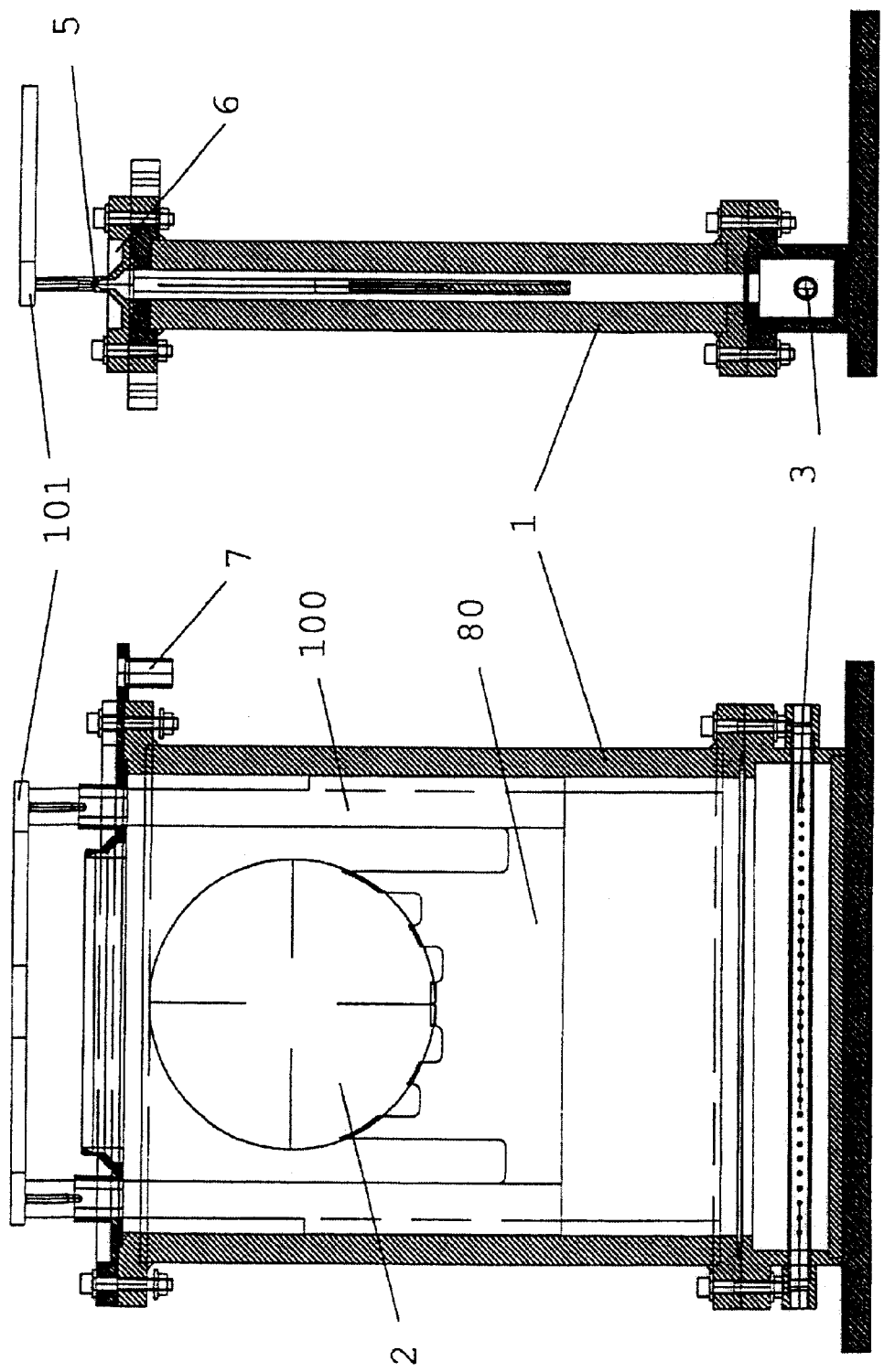
FIG. 10 represents a detailed view of a preferred embodiment of an apparatus according to the present invention.

It is preferable to have a smooth transition from a movement wherein the substrate is carried only by the support 80 to a movement wherein the substrate is carried only by the grippers 81. Preferably, for the upward movement, the support 80 will only retreat downwards after the grippers 81 have gripped the substrate and subsequently pull it out of the tank. Instead of a flat support 80, a support having a sharp edge may be used, this edge reducing the contact zone between support and substrate to a minimum. Alternatively, a support having several contact zones along a semi-circle may be used to provide a more stable way of holding the substrate. An example of this is shown in FIG. 10. It is an advantage of the mechanism of FIG. 8, that the grippers 81 are never immersed in the liquid, and therefore remain dry at all times. Only the support 80 is constantly immersed. There are no gripping devices or supports which are immersed at one point and separated from the liquid at another: this avoids problems with liquid remaining at the contact zones with grippers or supports. In an alternate embodiment, devices other than support 80 and grippers 81 may be used.

The removal of the last droplet attached to the last part of the substrate leaving the tank, can be done by optimizing the shape of the slit 5 on top of the liquid tank, and reducing the vertical lift speed just before the substrate detaches from the liquid in the tank.

Figure 9A:
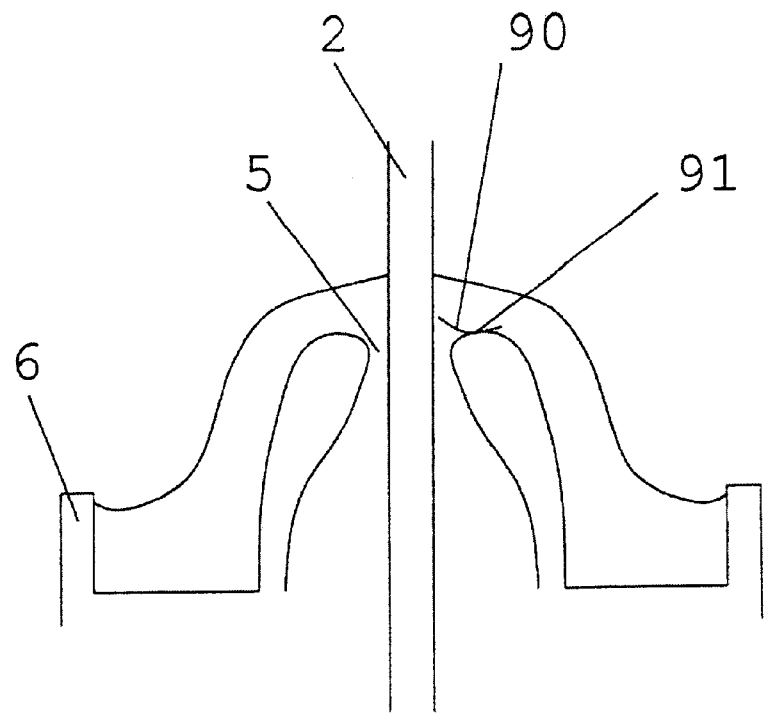
FIGS. 9a and 9b represent two embodiments of an apparatus of the invention, wherein a last droplet is removed.
Figure 9B:
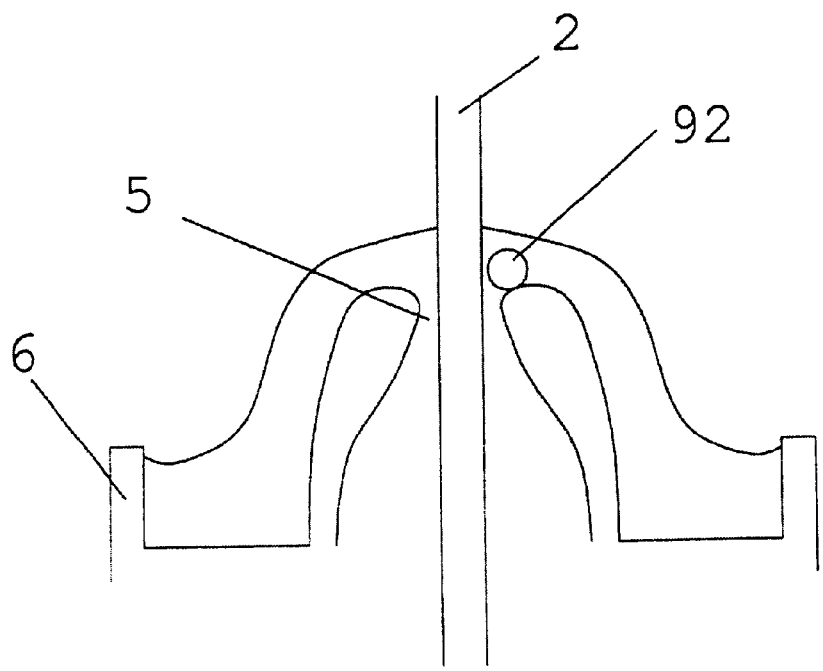

According to the present invention, another solution is the installation of a "last-droplet-take-up device". According to a first embodiment, this is a fiber, which has a high affinity for the liquid. FIG. 9a shows an enlarged view of such a fiber 90, which is close to the surface of the substrate 2 as the substrate moves upward, the fiber being attached to the top of the tank in point 91. When the lower point of the substrate emerges from the slit 5, a drop that is attached to said lowest point, will glide downward onto the glass-fiber, and subsequently flow into the gutter 6. Glass fibers are preferably used when the cleaning liquid is an aqueous solution. They can be placed on one or both sides of the slit 5. Also other materials such as sponge-like foams could be useful (e.g. Poly Vinyl Alcohol). A piece 92 of such a foam can then be attached to one or both sides of the slit 5, see FIG. 9b. The small amount of liquid taken up by these pieces of foam needs to disappear sufficiently fast in order to avoid loading problems due to accumulated liquid take-up. This in itself could be done by a sufficient ventilation with an ambient in which the liquid evaporates. In case of an aqueous solution, this could be e.g. dry air or dry $N_2$. These sponges could be small rollers.

According to a preferred embodiment, the droplet take-up device, be it a fiber or a foam, are movably attached to the top of the tank, and are moved towards the substrate at the moment when the last part of the substrate passes the take-up device.

Another solution for the removal of the last droplet is the local application of a small amount of a second liquid that displaces the first liquid and then readily evaporates, e.g. isopropyl alcohol.

FIG. 10 shows a detailed view of an apparatus according to the invention, in particular of the tank 1 for treating and cleaning a single substrate 2. The support 80 is visible. It is mounted on a slide 100, which can be pulled up with a handle 101. The hole 3 is visible for letting in liquid for compensating the overflow. The convergent cross section leading up to the slit 5 is equally apparent, as are the gutter 6 and drain 7. The nozzles or other means for creating surface tension gradient are not represented on this drawing.

Although certain presently preferred embodiments of the invention have been described herein, it will be apparent to those skilled in the art to which the invention pertains that variations and modifications of the described embodiment may be made without departing from the spirit and scope of the invention. Accordingly, it is intended that the invention be limited only to the extent required by the appended claims and the applicable rules of law.

What is claimed is:

1. A method for removing liquid from at least one flat surface of a substrate, said method comprising the steps of:
   introducing said substrate in a tank;
   filling said tank with a liquid, the liquid having a liquid surface;
   performing at least one liquid treatment step on said substrate; and
   lowering surface tension at at least a part of the liquid surface;
   removing said substrate from said tank in an essentially vertical direction, said direction being parallel to said substrate surfaces that are to be dried, through an opening in a top part of said tank, so that a liquid flow out of said tank is produced between said substrate and said opening during the passage of said substrate through said opening,
   wherein the step of lowering said surface tension is performed, at least a part of time, simultaneously with the step of removing said substrate from said tank.

2. A method for removing liquid from at least one flat surface of a substrate, said method comprising the steps of:
   introducing said substrate in a tank;
   filling said tank with a liquid;
   performing at least one liquid treatment step on said substrate;
   removing said substrate from said tank in an essentially vertical direction, said direction being parallel to said substrate surfaces that are to be dried, through an opening in a top part of said tank, so that a liquid flow out of said tank is produced between said substrate and said opening during the passage of said substrate through said opening; and
   directing a flow of a gaseous substance at an intersection line between said substrate surface that is to be dried and said liquid, in such a way that a plane comprising both the speed vector of the substrate movement and of said flow of a gaseous substance is perpendicular to said surface of said substrate that is to be dried, the step of directing a flow of a gaseous substance being performed simultaneously with said step of removing said substrate.

3. A method according to claim 1, wherein said step of filling said tank occurs before said step of introducing said substrate.

4. A method according to claim 1, wherein said step of filling said tank occurs after said step of introducing said substrate.

5. A method according to claim 1, wherein the liquid treatment step is selected from the group consisting of wet etching step, wet cleaning step and wet rinsing step.

6. A method according to claim 2, wherein said substrate has parallel flat surfaces,
wherein said flow of a gaseous substance is produced through a narrow opening of a device positioned in such a way that said narrow opening is parallel to said flat surfaces, and
wherein speed, pressure and direction of said flow is equal in each point of said narrow opening.

7. A method according to claim 6, wherein said gaseous substance is selected from the group consisting of a non-heated tensio-active gas, a heated tensio-active gas, a non-heated tensio-active vapor, a heated tensio-active vapor, a heated inert gas, and a mixture of at least two of the preceding gaseous substances.

8. A method for removing liquid from at least one surface of a substrate, said method comprising the steps of:
introducing said substrate in a tank;
filling said tank with a liquid, the liquid having a liquid surface;
performing at least one liquid treatment step on said substrate; and
lowering surface tension at at least a part of the liquid surface;
removing said substrate from said tank in an essentially vertical direction, said direction being parallel to said substrate surfaces that are to be dried, through an opening in the top part of said tank, so that a liquid flow out of said tank is produced between said substrate and said opening during the passage of said substrate through said opening,
wherein the step of lowering said surface tension is performed, at least a part of time, simultaneously with the step of removing said substrate from said tank.

9. A method for removing liquid from at least one surface of a substrate, said method comprising the steps of:
introducing said substrate in a tank;
filling said tank with a liquid;
performing at least one liquid treatment step on said substrate;
removing said substrate from said tank in an essentially vertical direction, said direction being parallel to said substrate surfaces that are to be dried, through an opening in the top part of said tank, so that a liquid flow out of said tank is produced between said substrate and said opening during the passage of said substrate through said opening; and
directing a heat supply at the intersection line between a substrate surface that is to be dried, and said liquid, said heat supply being produced along a line perpendicular to the substrate movement, in such a way that the same heat is produced in every point of said line, the step of directing a heat supply being performed simultaneously with said step of removing said substrate.

10. A method according to claim 8, wherein said step of filling said tank occurs before said step of introducing said substrate.

11. A method according to claim 8, wherein said step of filling said tank occurs after said step of introducing said substrate.

12. A method according to claim 9, wherein said substrate has two parallel flat surfaces, and
wherein during the removal of said substrate, a flow of liquid takes place between said flat surfaces and the sides of said opening neighboring said flat surfaces, so that in at least one cross section perpendicular to the substrate surfaces, said flow is uni-directional and essentially non-turbulent.

13. A method according to claim 12, wherein the liquid is water,
wherein the substrate is a hydrophilic silicon substrate,
wherein the water is at room temperature, and
wherein speed at which the substrate is removed from the liquid is constant and at least equal to 15 mm/s.

14. A method according to claim 12, wherein speed at which the substrate is removed from the liquid is reduced prior to when a last part of the substrate passes through the opening.

15. A method according to claim 14, further comprising the step of bringing the last part of said substrate into contact with an object, in order to remove a last droplet attached to said last part.

16. A method according to claim 15, further comprising the step of holding said substrate after removal from said substrate from said tank, and directing a flow of a gaseous substance essentially parallel to the surfaces of said substrate that are to be dried.

17. A method for removing liquid from at least one surface of a substrate, said method comprising the steps of:
introducing said substrate in a tank;
filling said tank with a liquid, the liquid having a liquid surface;
lowering surface tension at at least a part of the liquid surface; and
removing said substrate from said tank in an essentially vertical direction, said direction being parallel to said substrate surfaces that are to be dried, through an opening in a top part of said tank, so that a liquid flow out of said tank is produced between said substrate and said opening during the passage of said substrate through said opening,
wherein the step of lowering said surface tension is performed, at least a part of time, simultaneously with the step of removing said substrate from said tank.

18. A method according to claim 17, wherein the step of introducing said substrate in a tank is performed before the step of filling said tank with a liquid.

19. A method according to claim 17, wherein the step of lowering surface tension comprises directing a flow of a gaseous substance at a portion of the substrate.

20. A method according to claim 17, wherein the step of lowering surface tension comprises directing a flow of a gaseous substance at the liquid surface.

21. A method according to claim 17, wherein the step of lowering surface tension comprises directing a flow of a gaseous substance at an interface between the liquid surface and the substrate.

22. A method according to claim 17, wherein the step of lowering surface tension comprises directing a flow of a gaseous substance at an intersection line between said substrate surface that is to be dried and said liquid, in such a way that a plane comprising both the speed vector of the substrate movement and of said flow of a gaseous substance is perpendicular to said surface of said substrate that is to be dried, the step of directing a flow of a gaseous substance being performed simultaneously with said step of removing said substrate.

23. A method according to claim 17, wherein the step of lowering surface tension comprises directing a heat supply at a portion of the substrate.

24. A method according to claim 17, wherein the step of lowering surface tension comprises directing a flow of a heat supply at the liquid surface.

25. A method according to claim 17, wherein the step of lowering surface tension comprises directing a flow of a heat supply at an interface between the liquid surface and the substrate.

26. A method according to claim 17, wherein the step of lowering surface tension comprises directing a heat supply at the intersection line between a substrate surface that is to be dried, and said liquid, said heat supply being produced along a line perpendicular to the substrate movement, in such a way that the same heat is produced in every point of said line, the step of directing a heat supply being performed simultaneously with said step of removing said substrate.

* * * * *